(12) United States Patent
Takagi et al.

(10) Patent No.: US 10,854,449 B2
(45) Date of Patent: Dec. 1, 2020

(54) METHOD AND APPARATUS FOR FORMING SILICON FILM

(71) Applicant: TOKYO ELECTRON LIMITED, Tokyo (JP)

(72) Inventors: Satoshi Takagi, Nirasaki (JP); Hiroyuki Hayashi, Nirasaki (JP); Hsiulin Tsai, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/046,222

(22) Filed: Jul. 26, 2018

(65) Prior Publication Data

US 2019/0043719 A1 Feb. 7, 2019

(30) Foreign Application Priority Data

Aug. 2, 2017 (JP) .................................. 2017-149866

(51) Int. Cl.
*H01L 21/02* (2006.01)
*C23C 16/52* (2006.01)
(Continued)

(52) U.S. Cl.
CPC .... *H01L 21/02645* (2013.01); *C23C 16/0272* (2013.01); *C23C 16/045* (2013.01); *C23C 16/24* (2013.01); *C23C 16/402* (2013.01); *C23C 16/45544* (2013.01); *C23C 16/45546* (2013.01); *C23C 16/45553* (2013.01); *C23C 16/52* (2013.01); *H01L 21/0228* (2013.01);
(Continued)

(58) Field of Classification Search
CPC ......... H01L 21/02645; H01L 21/02499; H01L 21/02211; H01L 21/0262; H01L 21/02488; H01L 21/02507; C23C 16/45525; C23C 16/45553
See application file for complete search history.

(56) References Cited

U.S. PATENT DOCUMENTS

2012/0028437 A1* 2/2012 Watanabe ......... H01L 21/02164
438/425
2014/0349468 A1* 11/2014 Suzuki ................ H01L 21/0245
438/479
(Continued)

FOREIGN PATENT DOCUMENTS

| JP | 1217956 A | 8/1989 |
|---|---|---|
| JP | 2011249764 A | 12/2011 |
| JP | 2014127693 A | 7/2014 |

*Primary Examiner* — Kyoung Lee
*Assistant Examiner* — Christina A Sylvia
(74) *Attorney, Agent, or Firm* — Nath, Goldberg & Meyer; Jerald L. Meyer

(57) ABSTRACT

A method of forming a silicon film in a recess formed in a target substrate includes: preparing a target substrate having a recess in which a plurality of different bases is exposed; forming an atomic layer seed on at least an inner surface of the recess by sequentially supplying a raw material gas adapted to the plurality of different bases and a reaction gas reacting with the raw material gas to the target substrate one or more times while heating the target substrate to a first temperature; and forming a silicon film on a surface of the atomic layer seed so as to fill the recess by supplying a first silicon raw material gas to the target substrate while heating the target substrate to a second temperature.

16 Claims, 9 Drawing Sheets

(51) Int. Cl.
*C23C 16/40* (2006.01)
*C23C 16/455* (2006.01)
*C23C 16/04* (2006.01)
*C23C 16/02* (2006.01)
*C23C 16/24* (2006.01)

(52) U.S. Cl.
CPC ...... *H01L 21/0243* (2013.01); *H01L 21/0245* (2013.01); *H01L 21/0262* (2013.01); *H01L 21/02164* (2013.01); *H01L 21/02211* (2013.01); *H01L 21/02381* (2013.01); *H01L 21/02499* (2013.01); *H01L 21/02532* (2013.01); *H01L 21/02488* (2013.01); *H01L 21/02507* (2013.01); *H01L 21/02592* (2013.01)

(56) References Cited

U.S. PATENT DOCUMENTS

2015/0101532 A1* 4/2015 Okada ................. C23C 16/0272
 118/704
2017/0358458 A1* 12/2017 Okada ................. H01L 21/3065

* cited by examiner

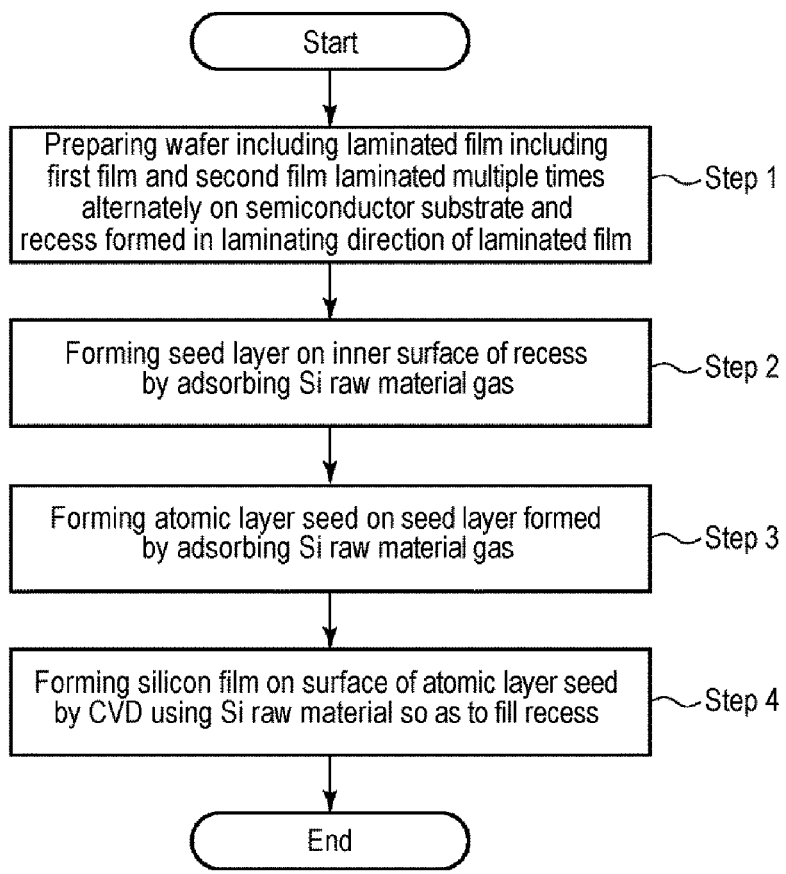

METHOD AND APPARATUS FOR FORMING SILICON FILM

CROSS-REFERENCE TO RELATED APPLICATION

This application is based upon and claims the benefit of priority from Japanese Patent Application No. 2017-149866, filed on Aug. 2, 2017, the entire contents of which are incorporated herein by reference.

TECHNICAL FIELD

The present disclosure relates to a method and apparatus for forming a silicon film.

BACKGROUND

Silicon such as amorphous silicon is used as a thin film for filling contact holes and lines of a semiconductor integrated circuit device and for forming devices and structures. As a method of depositing amorphous silicon, a chemical vapor deposition method (CVD method) of thermally decomposing a silicon raw material is used to form a film. For example, there has been proposed a method of forming an amorphous silicon film by thermal decomposition of a silicon raw material at 400 to 500 degrees C., at 350 to 450 degrees C., and at 300 to 400 degrees C. in cases of using disilane, trisilane, and tetrasilane, respectively, as the silicon raw material.

However, when a miniaturized contact hole or line is filled with an amorphous silicon film, step coverage in the contact hole of the amorphous silicon film is poor, which may cause large voids. The large voids in the contact holes or lines may increase a resistance value. One factor that causes such a problem is a poor degree of accuracy in surface roughness of the amorphous silicon film.

In order to improve the degree of accuracy in surface roughness of the amorphous silicon film, there has been proposed a technique in which a seed layer is formed in advance by supplying an aminosilane-based gas to a surface of a base and adsorbing the gas on the surface of the base before forming the amorphous silicon film, so that an incubation time is reduced and the degree of accuracy in surface roughness is improved.

There has also been proposed a technique in which, prior to forming an amorphous silicon film, an aminosilane-based gas is supplied to a surface of a base to forma first seed, and a disilane gas is further supplied to the first seed to form a second seed, thereby improving the degree of accuracy in surface roughness of the silicon film and the in-plane uniformity of the film thickness while coping with low temperature film formation.

However, recently, there has been a need to fill a silicon a trench, a hole, or the like formed in a laminated film in which heterogeneous films are laminated. In this case, a difference in film thickness between different bases may occur due to a difference in incubation time between the bases, which may make it difficult to obtain good filling property. In addition, in a case of filling a deep trench, film quality of bases may vary between the top and the bottom of the trench. In this case, a difference in incubation time between the top and the bottom may occur due to a difference in film quality between the bases, which may cause variation n film thickness and also make it difficult to obtain good filling property.

SUMMARY

Some embodiments of the present disclosure provide a silicon film forming method and apparatus capable of depositing a silicon film while reducing a difference in film thickness between different bases.

According to one embodiment of the present disclosure, a method of forming a silicon film in a recess formed in a target substrate is provided. The method includes: preparing a target substrate having a recess in which a plurality of different bases is exposed; forming atomic layer seed on at least an inner surface of the recess by sequentially supplying a raw material gas adapted to the plurality of different bases and a reaction gas reacting with the raw material gas to the target substrate one or more tortes while heating the target substrate to a first temperature; and forming a silicon film on a surface of the atomic layer seed so as to fill the recess by supplying a first silicon raw material gas to the target substrate while heating the target substrate to a second temperature.

According to another embodiment of the present disclosure, a method of forming a silicon film in a recess formed in a target substrate is provided. The method includes: preparing a target substrate including a laminated film formed by alternately laminating a $SiO_2$ film and a SiN film on a base, and a recess formed in a laminating direction of the $SiO_2$ film and the SiN film, wherein the $SiO_2$ film and the SiN film are exposed in a lateral surface of the recess; forming an atomic layer seed composed of a $SiO_2$ film on at least an inner surface of the recess by sequentially supplying a chlorine-containing Si compound gas and an oxidant to the target substrate one or more times while heating the target substrate to a first temperature; and forming a silicon film on a surface of the atomic layer seed so as to fill the recess by supplying a silicon raw material gas including a monosilane gas to the target substrate while heating the target substrate to a second temperature.

According to another embodiment of the present disclosure, there is provided an apparatus for forming a silicon film in a recess formed in a target substrate in which a laminated film is formed by alternately laminating a $SiO_2$ film and a SiN film on a base and the recess is formed in a laminating direction of the $SiO_2$ film and the SiN film, wherein the $SiO_2$ film and the SiN film are exposed on a lateral surface of the recess. The apparatus includes: a processing container that accommodates the target substrate; a gas supply part that supplies a predetermined gas into the processing container; a heating mechanism that heats an interior of the processing container; an exhaust mechanism that exhausts the interior of the processing container to a depressurized state; and a controller that controls the gas supply part, the heating mechanism, and the exhaust mechanism. The controller controls the gas supply part, the heating mechanism, and the exhaust mechanism so as to: form an atomic layer seed composed of a $SiO_2$ film on at least an inner surface of the recess by sequentially supplying a chlorine-containing Si compound gas and an oxidant from the gas supply part to the target substrate one or more times, while the interior of the processing container is depressurized by the exhaust mechanism and the target substrate is heated to a first temperature by the heating mechanism; and then form a silicon film on a surface of the atomic layer seed so as to fill the recess by supplying a silicon raw material gas including a monosilane gas from the gas supply part to the target substrate while the target substrate is heated to a second temperature by the heating mechanism.

According to another embodiment of the present disclosure, a non-transitory computer-readable storage medium storing a computer-operable program for controlling a silicon film forming apparatus is provided. When executed, the program causes a computer to control the silicon film forming apparatus so as to perform the above described silicon film forming method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart showing a method of forming silicon film according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Embodiment of Silicon Film Forming Method>

FIG. 1 is a flowchart showing a method of forming a silicon film according to an embodiment of the present disclosure and FIG. 2 is a process sectional view thereof.

In the present embodiment, a target substrate has a recess in which a plurality of different bases is exposed, and a silicon film is formed in the recess. For example, a recess such as a trench is formed in a laminated film, which is formed by laminating a plurality of different films on a substrate, in a laminating direction of the laminated film and a silicon film is formed with the plurality of different films exposed on a lateral surface of the recess as bases. As used herein, the term "different bases" is meant to include a case where materials of the bases are different, a case where base forming methods are different even though the same base material is used, a case where film qualities are different even though the same base material is used, and the like.

Specific examples will be described below.

Figure 2A:
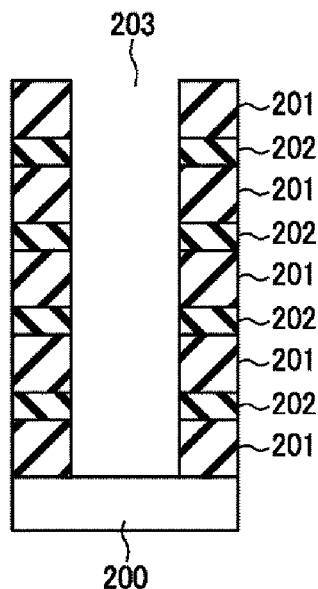
FIGS. 2A to 2D are process sectional views showing the method of forming a silicon film according to the embodiment of the present disclosure.

First, as shown in FIG. 2A, a semiconductor wafer (hereinafter simply referred to as a "wafer") is prepared. The wafer includes a semiconductor base 200 made of silicon or the like, a laminated film including a first film 201 and a second film 202, which are different from each other and are alternately laminated plural times on the semiconductor base 200, and a recess 203 such as a trench or a hole formed in a laminating direction of the laminated film (Step S1).

It is to be understood that the number of types of film is not limited to two but a recess may be formed after three or more types of different films are laminated. A film serving as a base is not particularly limited but may be a film usually used as a base of a silicon film, for example, a high-k film such as a $SiO_2$ film, a SiN film, a TIN film, an $Al_2O_3$ film, and the like. Further, these films may be formed by various methods. For example, the $SiO_2$ film may be formed by CVD, ALD, thermal oxidation, and the like.

Figure 2B:
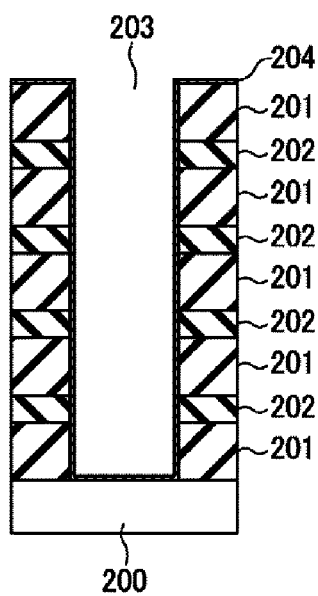

Next, as shown in FIG. 2B, a Si raw material gas is adsorbed on the inner side of the recess 203 to form a seed layer 204 (step S2).

As the silicon raw material gas, an aminosilane-based gas containing high-order aminosilane may be suitably used. This is to improve a degree of accuracy in surface roughness by reducing an incubation time. A dichlorosilane (DCS) gas or a hexachlorodisilane (HCD) may also be used instead of the aminosilane-based gas. When the aminosilane-based gas is used, a temperature may be set to 200 to 450 degrees C., for example, 300 degrees C. When the DCS gas or the FWD gas is used, the temperature may be about 300 to 600 degrees C. However, this step is not mandatory.

Figure 2C:
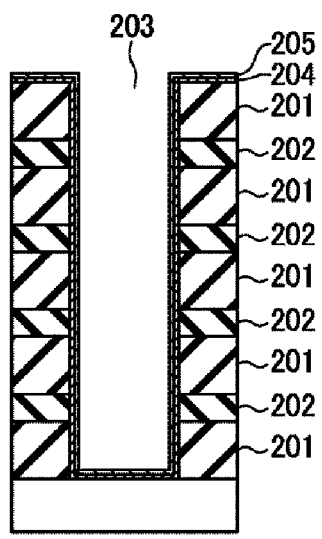

Next, as shown in FIG. 2C, an atomic layer seed (ALS) 205 is formed on the seed layer 204 obtained by adsorbing the Si raw material gas (step S3).

The atomic layer seed 205 is formed as an extremely thin film of 0.1 to 0.5 nm using an atomic layer deposition (ALD) method in which a raw material gas and a reaction gas are sequentially supplied one time or plural times alternately. The number of supply times is determined depending on a film thickness of the atomic layer seed to be obtained, and is typically about one to ten. Either of the raw material gas and the reaction gas may be supplied first. After these gases are supplied, the interior of a processing container may be purged. The atomic layer seed 205 cancels the influence of a base in the subsequent silicon film forming process, as will be described later.

Figure 2D:
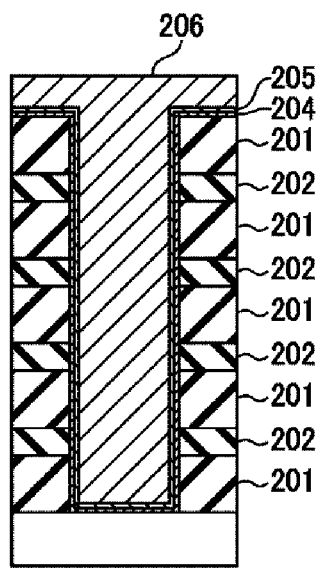

Next, as shown in FIG. 2D, a silicon film 206 is formed on the surface of the atomic layer seed 205 by CVD using a Si raw material so as to fill the recess 203 such as a trench and a hole (step S4). The silicon film 206 is typically an amorphous silicon film.

For example, a monosilane ($SiH_4$) gas may be used as a raw material gas to form the silicon film 206. By using the $SiH_4$ gas, it is possible to obtain a silicon film having good step coverage.

In some embodiments, the silicon film may be formed by supplying a $SiH_4$ gas and a chlorine-containing Si compound gas as Si precursor gases (Co-Flow). For example, a DCS gas, an HCD gas, or the like may be suitably used as the chlorine-containing Si compound gas. A trichlorosilane (TCS) gas may be also be used. The $SiH_4$ gas and the chlorine-containing Si compound gas may be supplied simultaneously or sequentially. Further, a flow rate ratio of chlorine-containing Si compound gas (flow rate of chlorine-containing Si compound gas/(flow rate of chlorine-containing Si compound gas+flow rate of $SiH_4$ gas)) may be, in some embodiments, 0.01 to 0.9.

In forming the silicon film, by performing Co-Flow of the $SiH_4$ gas and the chlorine-containing Si compound gas as described above, after the chlorine-containing Si compound gas is adsorbed on the base, adsorption of the $SiH_4$ gas is blocked. Thus, film formation at the top of the recess is suppressed. Such effect is reduced at the bottom of the recess and the $SiH_4$ gas is supplied to the bottom. Accordingly, step coverage is improved. Further, migration of Si can be suppressed due to the existence of Cl bonds. Furthermore, since a nucleation density increases, smoothness in the surface of the silicon film can be improved.

The silicon film may be formed under a temperature of 400 to 550 degrees C. and a pressure of 0.1 to 5.0 Torr (13.3 to 666.6 Pa).

<Atomic Layer Seed>

Next, the atomic layer seed will be described in detail.

Figure 3:
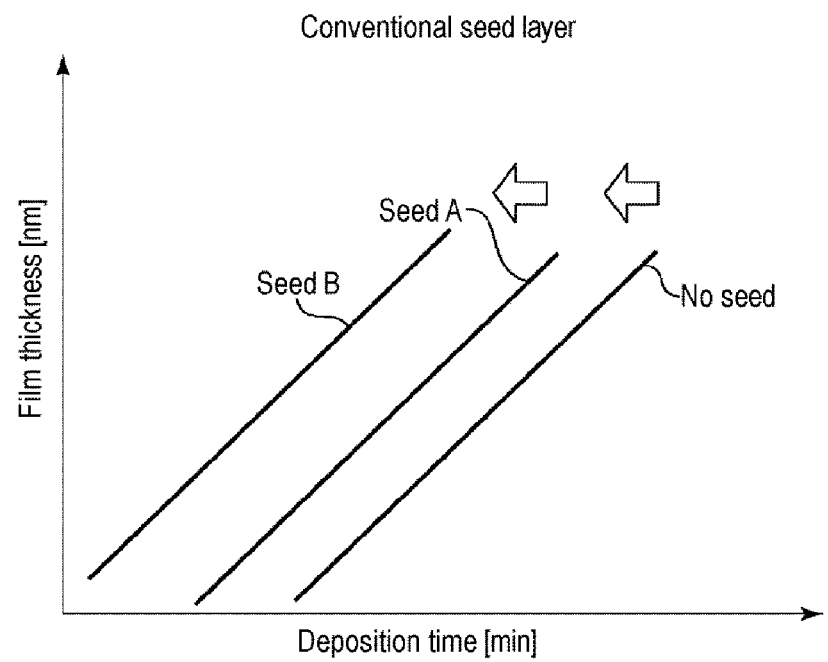
FIG. 3 is a diagram for explaining a function at which a conventional seed layer aims.

Conventionally, a seed layer used for formation of a silicon film by CVD aimed at obtaining a flat film with good step coverage by adsorbing a Si raw material gas such as an aminosilane-based gas on a surface of a base to reduce an incubation time as shown in FIG. 3. However, although the incubation time can be reduced by adsorbing the silicon raw material, film formation is influenced by a base of a film. Thus, when a silicon film is formed on different bases, a difference in incubation time between the different bases occurs, which causes a difference in film thickness between the different bases.

Figure 4:
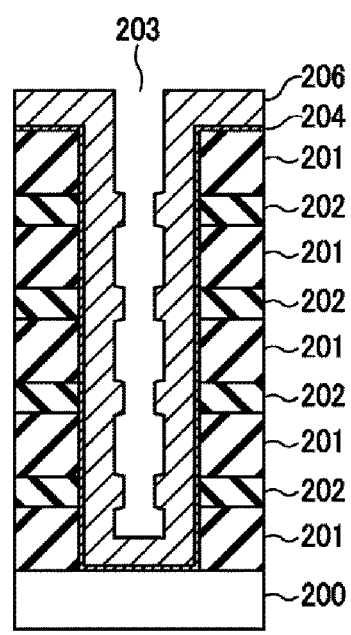
FIG. 4 is a view showing a state in which a silicon film is formed after forming a conventional seed layer on a wafer having a structure in which a $SiO_2$ film and a SiN film are exposed as bases on a lateral surface of a recess.

For example, in the case of FIG. 2B, when an aminosilane seed layer is used as the seed layer and the first film 201 and the second film 202 are a $SiO_2$ film and a SiN film, respectively, as shown in FIG. 4, the silicon film 206 is formed to have different film thicknesses on the first film 201 as the $SiO_2$ film and on the second film 202 as the SiN film. Thus, unevenness is generated in a surface of a target to be filled, which makes it is difficult to perform good filling.

Figure 5:
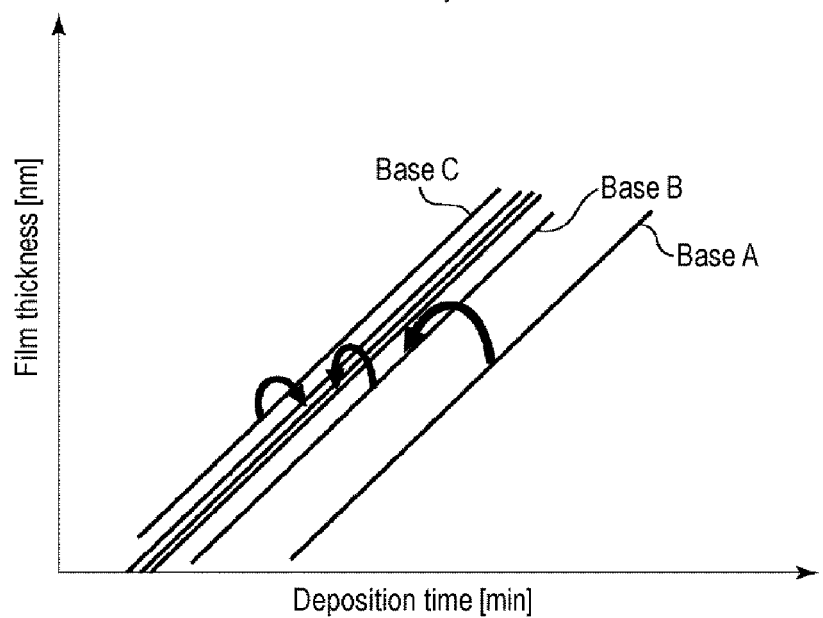
FIG. 5 is a diagram for explaining a function at which an atomic layer seed used embodiment of the present disclosure aims.

In contrast, the atomic layer seed aims at suppressing the influence of the base because the atomic layer seed is formed on the base by the ALD method. Therefore, as shown in FIG. 5, it is possible to cancel a difference in incubation time between a plurality of bases having different incubation times. In other words, for all the bases, the incubation times become substantially the same to that on the atomic layer seed. Therefore, when a silicon film is formed on different bases, a difference in film thickness can be reduced, thereby achieving a good filling property.

Figure 6:
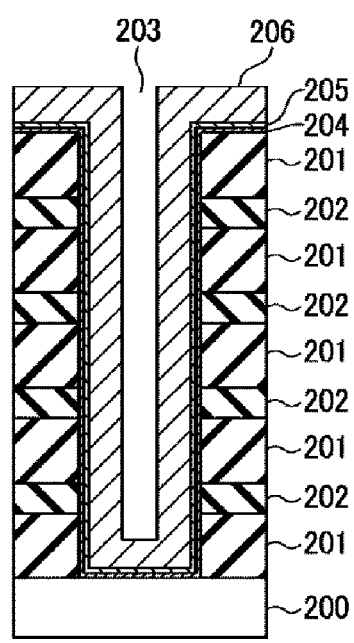
FIG. 6 is a view showing a state in which a silicon film is formed after an atomic layer seed according to the embodiment of the present disclosure is formed on a wafer having a structure in $SiO_2$a film and a SiN film are exposed as bases on a lateral surface of a recess.

For example, in the case of FIG. 2C, when an aminosilane seed layer is used as the seed layer 204 and an $SiO_2$ film formed using a DCS gas and a $N_2O$ gas is used as the atomic layer seed 205, as shown in FIG. 6, the silicon film 206 is formed such that the film thickness on the first film 201 which is the $SiO_2$ film and the film thickness on the second film 202 which is the SiN film become substantially the same, thereby achieving the good filling property.

As described above, the atomic layer seed is formed as an extremely thin film of 0.1 to 0.5 nm by sequentially and alternately supplying a raw material gas and a reaction gas one or more times. At this time, the raw material gas and the reaction gas may be appropriately selected depending on the type of base. When the base is made of a silicon-based material, a chlorine-containing Si compound gas, such as a DCS gas, a HCD gas, or the like may be, in some embodiments, used as the raw material gas. When the base is made of a Ti-based material such as TiN, a chlorine-containing Ti compound gas, such as a $TiCl_4$ gas or the like, may be in some embodiments used as the raw material gas. When the base is formed of a high-k film such as an $Al_2O_3$ film or the like, a compound gas containing metal of the high-k such as an $AlCl_3$ gas, may be in some embodiments used as the raw material gas. As the reaction gas, an oxidant such as a $N_2O$ gas, an $O_2$ gas, an $O_3$ gas, a $H_2O$ gas or the like, or a nitridant such as a $NH_3$ gas or the like may be used. Specifically, the atomic layer seed may be a $SiO_2$ film or a SiN film formed by a chlorine-containing Si compound gas and an oxidant or a nitridant, a TiN film formed by a chlorine-containing Ti compound gas and a nitridant, or a high-k film formed by a compound gas containing metal of the high-k film and an oxidant.

When the base consists mainly of $SiO_2$, for example, a $SiO_2$ film of at least one atomic layer formed by using a DCS gas as the raw material gas and a $N_2O$ gas as the reaction gas may be suitably used. The temperature in this case may be, in some embodiments, within the range of 100 to 600 degrees C. The atomic layer seed of the $SiO_2$ film formed by using the DCS gas and the $N_2O$ gas is effective when the base contains a mixture of the $SiO_2$ film and the SiN film.

When the base consists mainly of SiN, for example, a SiN film of at least one atomic layer formed by using a DCS gas as the raw material gas and a $NH_3$ gas as the reaction gas may be suitably used. When the base consists mainly of TiN, for example, a TiN film of at least one atomic layer formed by using a $TiCl_4$ gas as the raw material gas and a $NH_3$ gas as the reaction gas may be suitably used.

As described above, by using the atomic layer seed, when a silicon film is formed on a plurality of different bases, it is possible to cancel a difference in incubation time due to the bases and to eliminate the dependence of the film formation on the bases. Thus, the silicon film can be formed on the different bases with a uniform film thickness, thereby achieving the good property of filling in the recess.

In addition to using the above-described atomic layer seed, by performing Co-Flow which supplies a gas and a chlorine-containing Si compound gas in the process of forming the silicon film, the smoothness and step coverage of the surface of the silicon film can be further improved.

Further, prior to the formation of the atomic layer seed, the incubation time itself after forming the atomic layer seed can be reduced by forming a seed layer by adsorbing an aminosilane-based gas or the like.

<Silicon Film Forming Apparatus>

Figure 7:
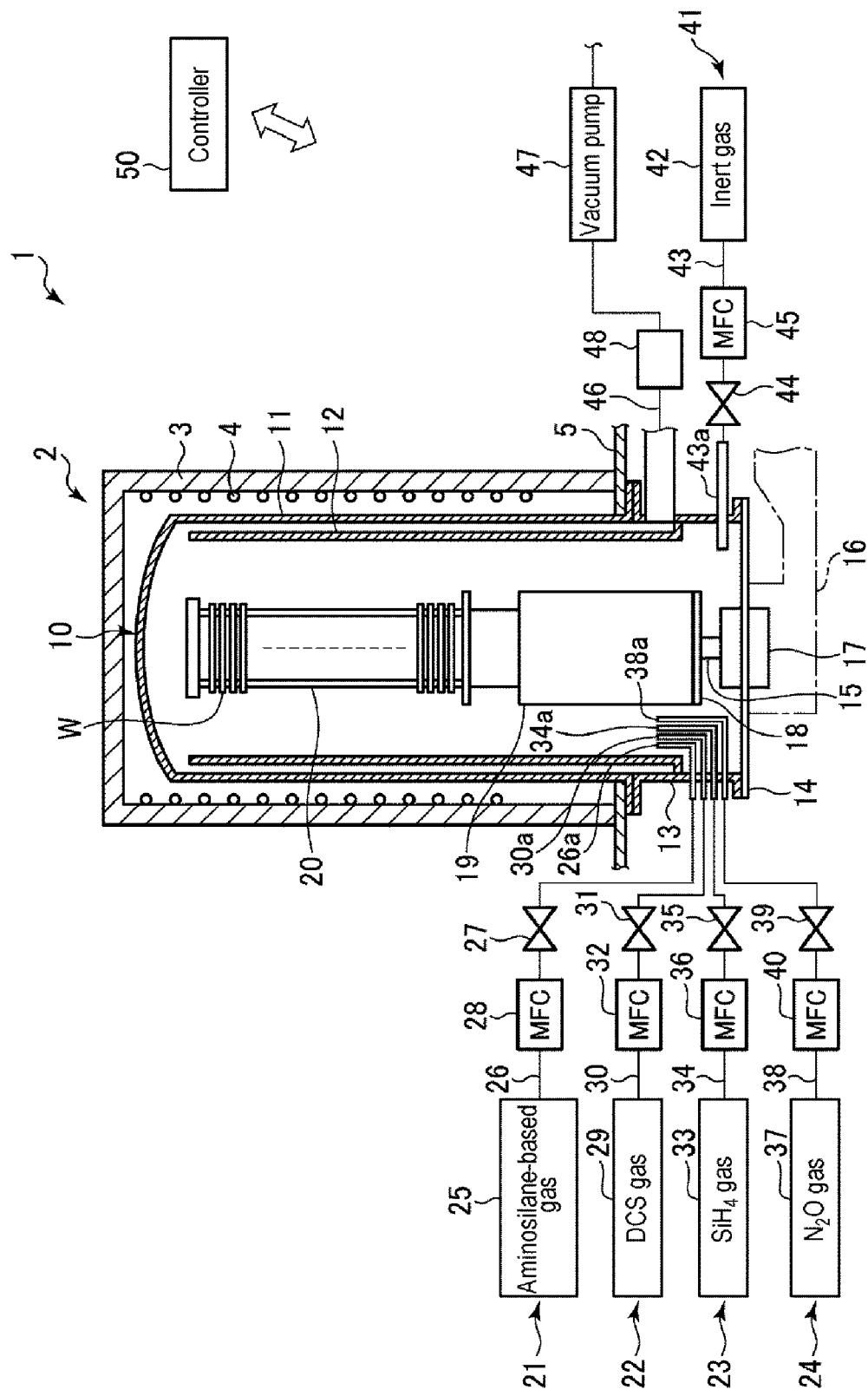
FIG. 7 is a sectional showing an example of a silicon film forming apparatus for carrying out the silicon film forming method according to the present disclosure.

Next, an example of an apparatus for carrying out the method of forming a silicon film will be described. FIG. 7 is a sectional view showing an example of a silicon film forming apparatus for forming a silicon film of the present disclosure.

Here, an apparatus for forming an aminosilane seed layer formed by using an aminosilane-based gas, an atomic layer seed formed of a $SiO_2$ film by using a DCS gas and a $N_2O$ gas, and then a silicon film will be described by way of an example.

A silicon film forming apparatus 1 includes a heating furnace 2. The heating furnace 2 includes a cylindrical heat insulating body 3 having a ceiling portion and a heater 4 installed on the inner peripheral surface of the heat insulating body 3. The heating furnace 2 is installed on a base plate 5.

A processing container 10 is arranged in the heating furnace 2. The processing container 10 has a double tube structure having an outer tube 11, which is made of, e.g., quartz, and has an upper end closed, and an inner tube 12, which is made of, e.g., quartz and is concentrically disposed in the outer tube 11. The heater 4 surrounds the outside of the processing container 10.

A lower end of each of the outer tube 11 and the inner tube 12 is held by a cylindrical manifold 13 made of stainless steel or the like. An openable/closable cap 14 is installed at a lower end opening of the manifold 13 so as to hermetically seal the opening.

A rotary shaft 15, which is configured to rotate in an airtight state by a magnetic seal, is inserted into and passes through the center portion of the cap 14. The lower end of the rotary shaft 15 is connected to a rotation mechanism 17 of an elevating table 16, and the upper end of the rotary shaft 15 is fixed to a turntable 18. A wafer boat 20, which is a substrate holder made of quartz for holding a semiconductor wafer (hereinafter simply referred to as a wafer) as a substrate to be processed, is placed on the turntable 18 via a heat insulating barrel 19. The wafer boat 20 is configured so as to accommodate 50 to 150 sheets of wafers W stacked at a pitch of a predetermined interval.

The wafer boat 20 can be loaded into and unloaded from the processing container 10 by moving the elevating table 16 upward and downward by an elevating mechanism (not shown). When the wafer boat 20 is loaded into the processing container 10, the cap 14 is brought into close contact with the manifold 13, hermetically sealing a space therebetween.

The silicon film forming apparatus 1 further includes an aminosilane-based gas supply mechanism 21 for supplying an aminosilane-based gas into the processing container 10, a DCS gas supply mechanism 22 for supplying a DCS gas into the processing container 10, a $SiH_4$ gas supply mechanism 23 for supplying a $SiH_4$ gas into the processing container 10, a $N_2O$ gas supply mechanism 24 for supplying a $N_2O$ gas as an oxidant into the processing container 10, and an inert gas supply mechanism 41 for supplying an inert gas used as a purge gas or the like into the processing container 10. The aminosilane-based gas supply mechanism 21, the DCS gas supply mechanism 22, the $SiH_4$ gas supply mechanism 23, the $N_2O$ gas supply mechanism 24, and the inert gas supply mechanism 41 constitute a gas supply part.

The aminosilane-based gas supply mechanism 21 includes an aminosilane-based gas supply source 25, an aminosilane-based gas pipe 26 that guides an aminosilane-based gas from the aminosilane-based gas supply source 25, and an aminosilane-based gas nozzle 26a which is made of quartz and is connected to the aminosilane-based gas pipe 26 through the lower portion of the side wall of the manifold 13. An opening/closing valve 27 and a flow rate controller 28 such as a mass flow controller are installed in the aminosilane-based gas pipe 26 so that the aminosilane-based gas can be supplied while a flow rate of the aminosilane-based gas is controlled.

The DCS gas supply mechanism 22 includes a DCS gas supply source 29, a DCS gas pipe 30 that guides an DCS gas from the DCS gas supply source 29, and a DCS gas pipe 30 which is made of quartz and is connected to the DCS gas pipe 30 through the lower portion of the side wall of the manifold 13. An opening/closing valve 31 and a flow rate controller 32 such as a mass flow controller are installed in the DCS gas pipe 30 so that the DCS gas can be supplied while a flow rate of the DCS gas is controlled.

The $SiH_4$ gas supply mechanism 23 includes a $SiH_4$ gas supply source 33 for supplying a $SiH_4$ gas, a $SiH_4$ gas pipe 34 that guides the $SiH_4$ gas from the $SiH_4$ gas supply source 33, and a $SiH_4$ gas nozzle 34a which is made of quartz and is connected to the $SiH_4$ gas pipe 34 through the lower portion of the side wall of the manifold 13. An opening/closing valve 35 and a flow rate controller 36 such as a mass flow controller are installed in the $SiH_4$ gas pipe 34 so that the $SiH_4$ gas can be supplied while a flow rate of the $SiH_4$ gas is controlled.

The $N_2O$ gas supply mechanism 24 includes a $N_2O$ gas supply source 37 for supplying a $N_2O$ gas, a $N_2O$ gas pipe 38 that guides the $N_2O$ gas from the $N_2O$ gas supply source 37, and a $N_2O$ gas nozzle 38a which is made of quartz and is connected to the $N_2O$ gas pipe 38 through the lower portion of the side wall of the manifold 13. An opening/closing valve 39 and a flow rate controller 40 such as a mass flow controller are installed in the $N_2O$ gas pipe 38 so that the $N_2O$ gas can be supplied while a flow rate of the $N_2O$ gas pipe 38 is controlled.

The inert gas supply mechanism 41 includes an inert gas supply source 42, an inert gas pipe 43 that guides an inert gas from the inert gas supply source 42, and an inert gas nozzle 43a which is connected to the inert gas pipe 43 through the lower portion of the side wall of the manifold 13. An opening/closing valve 44 and a flow rate controller 45 such as a mass flow controller are installed in the inert gas pipe 43. As the inert gas, a $N_2$ gas or a rare gas such as an Ar gas can be used.

An exhaust pipe 46 for discharging a processing gas from a gap between the outer tube 11 and the inner tube 12 is connected to the upper portion of the side wall of the manifold 13. A vacuum pump 47 for exhausting the interior of the processing container 10 is connected to the exhaust pipe 46, and a pressure adjustment mechanism 48 including a pressure regulating valve and the like is installed in the exhaust pipe 46. The interior of the processing container 10 is adjusted to a predetermined pressure by the pressure adjusting mechanism 48 while being evacuated by the vacuum pump 47.

The silicon film forming apparatus 1 further includes a controller 50. The controller 50 includes a main control part having a CPU (computer) for controlling various components of the silicon film forming apparatus 1, for example, valves, mass flow controllers as flow rate controllers, a driving mechanism such as an elevating mechanism, a heater power supply, and the like, an input device such as a keyboard and a mouse, an output device, a display device, and a storage device. The main control part of the controller 50 sets in the storage device a storage medium in which a processing recipe is stored, and causes the silicon film forming apparatus 1 to execute a predetermined operation based on the processing recipe called from the storage medium. Thus, under the control of the computer, the silicon film forming method as described above is performed by the silicon film forming apparatus 1.

<Method of Forming Silicon Film by Apparatus of FIG. 7>

Next, a processing operation when performing the above-described silicon film forming method with the silicon film forming apparatus as configured above will be described. The following processing operation is executed based on the processing recipe stored in the storage medium of the storage device in the controller 50.

For example, 50 to 150 sheets of wafers, each of the wafers including the semiconductor base 200 made of silicon or the like, the laminated film including the first film 201 formed of a $SiO_2$ film and the second film 202 formed of a SiN film which are alternately laminated plural times on the semiconductor base 200, and the recess 203 such as a trench or a hole formed in the laminating direction of the laminated film, as shown in FIG. 2A, are mounted on the wafer boat 20. The wafer boat 20 on which the wafers W are mounted is placed on the turntable 18 via the heat insulating barrel 19, and the elevating table 16 is moved upward. Thus, the wafer boat 20 is loaded into the processing container 10 from the lower end opening.

At this time, while introducing an inert gas into the processing container 10, the interior of the processing container 10 is heated by the heater 4 in advance so that the temperature of the center portion (in the vertical direction) of the wafer boat 20 is adjusted to a temperature suitable for forming an aminosilane seed layer by an aminosilane-based gas, for example, 300 to 450 degrees C., specifically 300 degrees C. Then, after reducing the internal pressure of the processing container 10 to 0.01 to 10 Torr (1.3 to 1,333.2 Pa), the opening/closing valve 27 is opened, and the aminosilane-based gas is supplied from the aminosilane-based gas supply source 25 into the processing container 10 (the inner tube 12) through the nozzle 26a facing upward at a flow rate of 1 to 5,000 sccm for 10 seconds or more. Thus, an aminosilane seed layer is formed.

Next, while the opening/closing valve 27 is closed and an inert gas is supplied to purge the interior of the processing container 10, the internal temperature of the processing container 10 is set to, for example, 300 to 550 degrees C., specifically 470 degrees C., and the internal pressure of the processing container 10 is adjusted to 0.01 to 5 Torr (1.3 to 666.6 Pa). Then, the opening/closing valve 31 is opened, and a DCS gas is supplied from the DCS gas supply source 29 into the processing container 10 at a flow rate of 1 to 5,000 sccm for 10 seconds or more to adsorb the DCS gas on the wafers. Thus, a silicon seed layer is formed. Next, the opening/closing valve 31 is closed and the interior of the processing container 10 is purged with an inert gas. Then, the opening/closing valve 39 is opened, and a $N_2O$ gas as art oxidant is supplied from the $N_2O$ gas supply source 37 into the processing container 10 at a flow rate of to 5,000 sccm for 10 seconds or more to oxidize the silicon seed layer. Thus, a $SiO_2$ film which is an atomic layer seed is formed. The thickness of the atomic layer seed may be, in some embodiments, 0.1 to 0.5 nm, and the DCS gas and the $N_2O$ gas may be supplied once. However, from the viewpoint of sufficiently suppressing the dependency on the base, the number of supply times of the DCS gas and the $N_2O$ gas may be increased to ten so as to form a thicker atomic layer seed. The temperature at this time may be, in some embodiments, within the range of 100 to 600 degrees C.

Next, with the opening/closing valves 31 and 39 closed, after the interior of the processing container 10 is purged by supplying the inert gas into the processing container 10, the internal temperature of the processing container 10 is set to 300 to 550 degrees C., specifically 470 degrees C., and the internal pressure of the processing container 10 is adjusted to 0.1 to 5 Torr (13.3 to 666.6 Pa). Then, the opening/closing valve 35 is opened and a $SiH_4$ gas is supplied. Alternatively, both the opening/closing valve 35 and the opening/closing valve 31 are opened and a $SiH_4$ gas and the DCS gas are supplied (Co-Flow). Thus, a silicon film is formed.

Thereafter, the opening/closing valve 35 or the opening/closing valves 31 and 35 are closed, and the inert gas is supplied into the processing container 10 to purge the interior of the processing container 10. After the internal pressure of the processing container 10 is returned to the normal pressure, the elevating table 16 is moved downward and the wafer boat 20 is unloaded.

As described above, by forming a silicon film after forming an atomic layer seed, when the bases are formed of a $SiO_2$ film and a SiN film, it is possible to cancel a difference in incubation time due to the bases and to eliminate the dependence of the film formation on the bases. Accordingly, it is possible to form a silicon film on the different bases, i.e., the $SiO_2$ film and the SiN film, with a uniform film thickness, thereby achieving the good filling property in the recess.

<Experimental Results>

Next, an experiment example will be described.

In the experiment example, a thermal oxide film (Th—$SiO_2$), a $SiO_2$ film (PE ALD $SiO_2$) by plasma ALD, a $SiO_2$ film (T ALD $SiO_2$) by thermal ALD, and a SiN film (PE ALD SiN) by plasma ALD were used as bases, and by using the apparatus illustrated in FIG. 7, a seed layer was formed on the surfaces of these bases and then a silicon film was formed by Co-Flow (Splits 1 to 3).

In Split 1, diisopropylaminosilane (DIPAS) (product name: LT0520) was used as an aminosilane-based gas and an aminosilane seed layer (AS) was formed under conditions including a flow rate of 200 sccm, a temperature of 380 degrees C., a pressure of 1 Torr (133.3 Pa), and a time of 30 min. Then, a silicon film (amorphous silicon film) was formed by CVD using Co-Flow of a $SiH_4$ gas and a DCS gas. The conditions of Co-Flow included a $SiH_4$ gas flow rate of 1,000 to 2,000 sccm, a DCS gas flow rate of 100 to 1,000 sccm, a temperature of 470 degrees C., a pressure of 3 Torr (400 Pa), and a time of 237 min (a target film thickness of 25 nm).

In Split 2, diisopropylaminosilane (DIPAS) (product name: LT0520) was used as an aminosilane-based gas and an aminosilane seed layer (AS) was formed under conditions including a flow rate of 200 sccm, a temperature of 350 degrees C., a pressure of 1 Torr (133.3 Pa), and a time of 3 min. Then, a disilane ($Si_2H_6$) gas was used to form a $Si_2H_6$ seed layer (DS) under conditions including a flow rate of 350 sccm, a temperature of 350 degrees C., a pressure of 1 Torr (133.3 Pa), and a time of 60 min. Then, a silicon film (amorphous silicon film) was formed under the same conditions as in Split 1.

In Split 3, an aminosilane seed layer (AS) was formed under the same conditions as in Split 2, a DCS gas was supplied at a flow rate of 500 sccm under a temperature of 470 degrees C. and a pressure of 3 Torr (400 Pa), and the interior of the processing container was purged. Then, a $N_2O$ gas was supplied at a flow rate of 500 sccm to form an atomic layer seed (ALS) under the conditions of a total time of 30 min. Then, a silicon film (amorphous silicon film) was formed under the same conditions as in Split 1.

Figure 8:
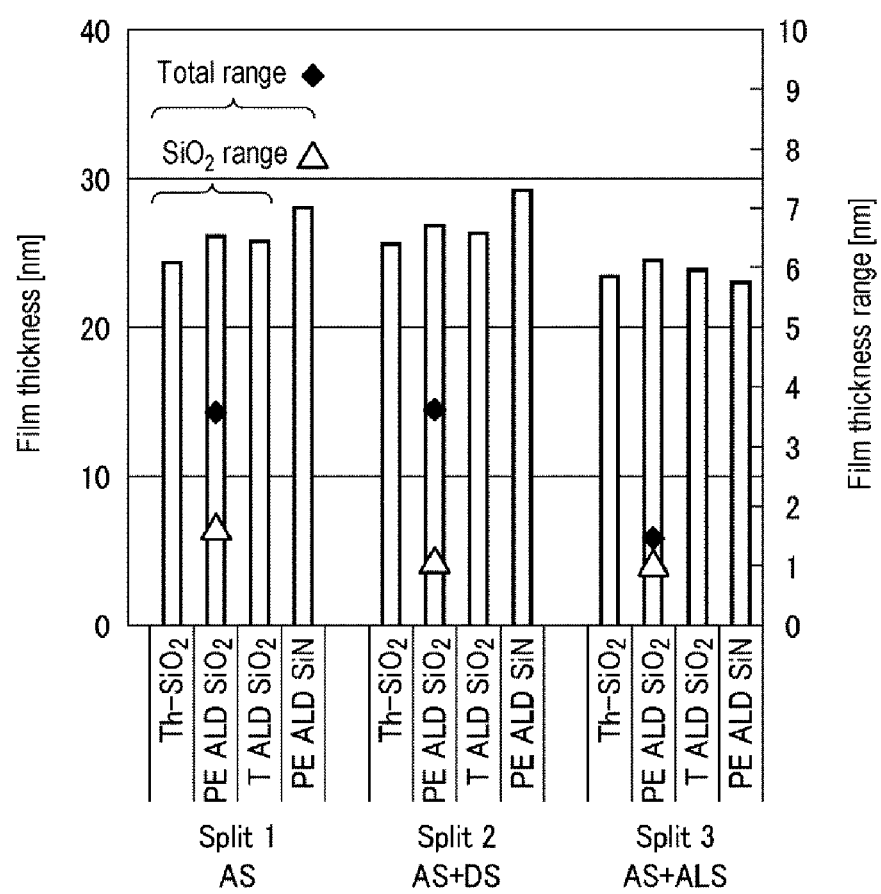
FIG. 8 is a chart showing a film thickness and a film thickness range for each base when a target film thickness is set to 25 nm under conditions of Splits 1 to 3 in an experimental example.

FIG. 8 shows a film thickness and a film thickness range for each base when the target film thickness is set to 25 nm under the conditions of Splits 1 to 3. The film thickness range is indicated by a SiO₂ film thickness range and a total film thickness range. It can be seen from FIG. 8 that a difference in film thickness between the SiO₂ film and the SiN film as the bases is large so that the total film thickness range is large in Splits 1 and 2, whereas the difference in film thickness due to the bases is small in Split 3 in which an atomic layer seed is formed.

Figure 9:
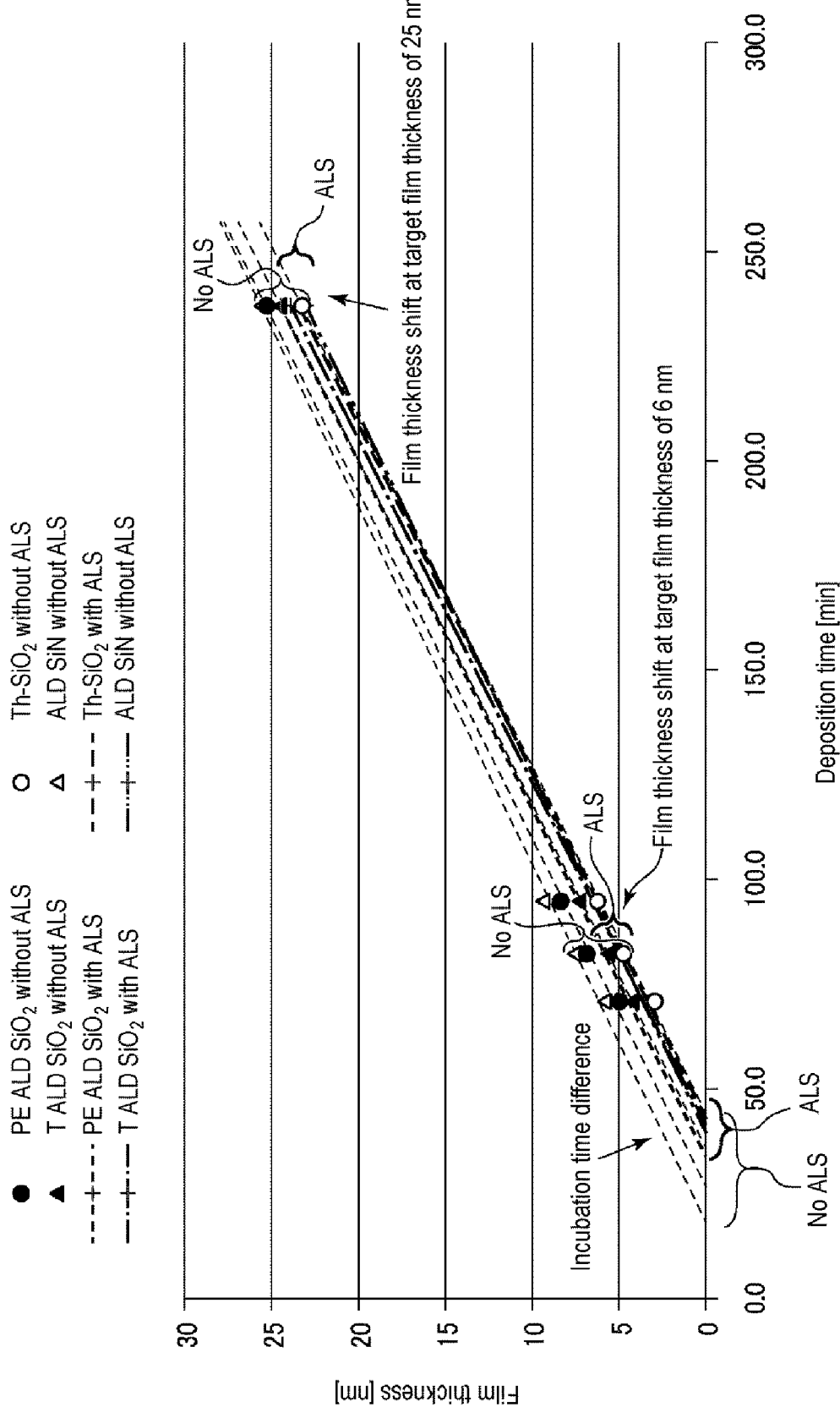
FIG. 9 is a graph showing a relationship between a film formation time and a film thickness for each base in a case where an atomic layer seed is used and a case where no atomic layer seed is used.

Next, similarly, using four kinds of bases, that is to say, Th—SiO₂, PE ALD SiO₂, ALD SiO₂, and PE ALD SiN, the relationship between the film formation time and the film thickness was investigated for a case where an atomic layer seed (ALS) was used (the same conditions as in Split 3) and a case where no atomic layer seed was used (the same conditions as in Split 1). The results are as shown in FIG. 9. It can be seen from FIG. 9 that, by using the atomic layer seed, a difference in incubation time between the bases decreases and a difference in film thickness for a predetermined target film thickness (film formation time) becomes also small.

Figure 10:
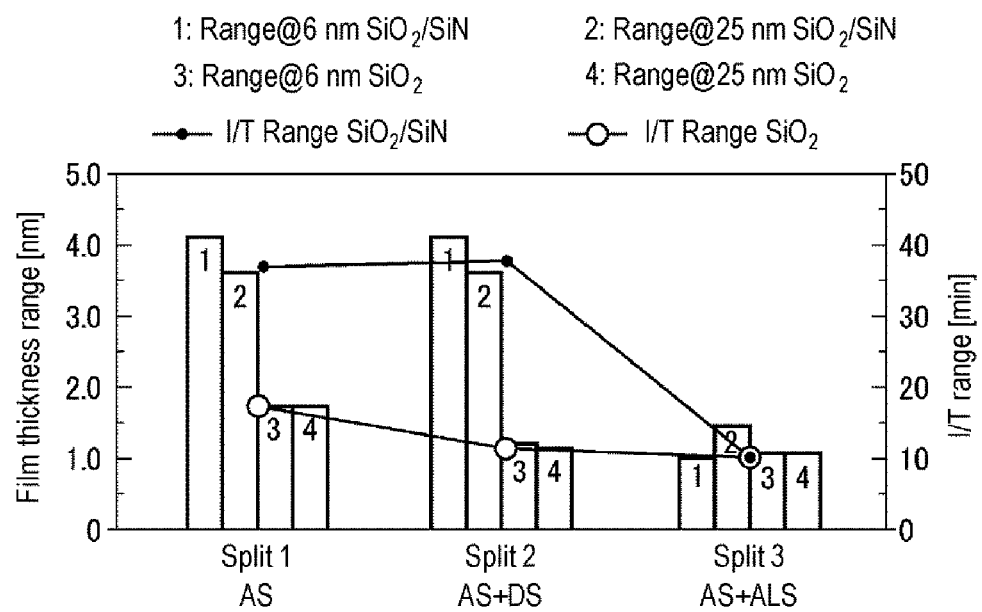
FIG. 10 is a chart showing a total film thickness range when a $SiO_2$ film and a SiN film are bases, a film thickness range when a $SiO_2$ film is a base, a total incubation time range when the $SiO_2$ film and the SiN film are the bases, and an incubation time range when the $SiO_2$ film is the base, given a target film thicknesses of 6 nm and 25 nm under the conditions of Splits 1 to 3.

Next, similarly, for the four kinds of bases, that is to say, Th—SiO₂, PE ALD SiO₂, T ALD SiO₂, and PE ALD SiN, a silicon film was formed under the conditions of Splits 1 to 3 with a target film thickness of 6 nm and a target film thickness of 25 nm. FIG. 10 shows a total film thickness range (Range@ 6 nm SiO₂/SiN and Range@ 25 nm SiO₂/SiN) when a SiO₂ film and a SiN film are bases, a film thickness range (Range@ 6 nm SiO₂ and Range@ 25 nm SiO₇) when the SiO₂ film is the base, a total incubation time range (I/T Range SiO₂/SiN) when the SiO₂ film and the SiN film are the bases, and an incubation time range (I/T Range SiO₂) when the SiO₂ film is the base.

It can be seen from FIG. 10 that for all the film thickness ranges and the incubation time ranges, the ranges decrease by using the atomic layer seed and, in particular, the total film thickness range and incubation time range when the SiO₂ film and the SiN film are the bases become very small. From this, it is confirmed that, by using the atomic layer seed, when the bases are the SiO₂ film and the SiN film, the difference in film thickness and the difference in incubation time become very small in the process of forming the silicon film on the bases.

<Other Applications>

While the embodiments of the present disclosure have been described above, the present disclosure is not limited to the above-described embodiments but various modifications can be made without departing from the spirit and scope of the present disclosure.

For example, although an example of carrying out the method of the present disclosure with a vertical batch type apparatus has been illustrated in the above-described embodiments, the present disclosure is not limited thereto but the method may be carried out with other various film forming apparatuses such as a horizontal batch type apparatus and a single wafer type apparatus.

Further, although a case where a recess is formed in a laminated film including different films in a laminating direction of the laminated film and a silicon film is formed on different bases exposed on the lateral surface of the recess has been illustrated in the above-described embodiments, the present disclosure is not limited thereto but may be applied to a case where a silicon film is formed on different bases, for example, a case where the film quality of the bases is different between the top and the bottom of the recess.

Furthermore, although a case where a semiconductor wafer in which different bases are formed on a semiconductor base as a substrate to be processed has been illustrated in the above-described embodiments, the present disclosure is not limited thereto but may be applied to other substrates such as a glass substrate and a ceramics substrate on which different bases can be formed.

According to the present disclosure in some embodiments, with respect to a substrate to be processed having a recess in which a plurality of different bases is exposed, a raw material gas adapted to the plurality of different bases and a reaction gas reacting with the raw material gas are sequentially supplied one or more times and an atomic layer seed as a film is formed by the reaction of the raw material gas and the reaction gas. Thus, it is possible to suppress the influence of the different bases in a silicon film forming process and to form a silicon film with a small film thickness difference due to the bases.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon film in a recess formed in a target substrate, comprising:
   preparing a target substrate having a recess in which a plurality of different bases is exposed;
   forming an atomic layer seed on at least an inner surface of the recess by sequentially supplying a raw material gas adapted to the plurality of different bases and a reaction gas reacting with the raw material gas to the target substrate one or more times while heating the target substrate to a first temperature; and
   forming a silicon film on a surface of the atomic layer seed so as to fill the recess by supplying a first silicon raw material gas to the target substrate while heating the target substrate to a second temperature,
   wherein the raw material gas is selected depending on material properties of the bases, and
   wherein the atomic layer seed is formed by using one of a chlorine-containing Si compound gas, a chlorine-containing Ti compound gas, and a compound containing metal of a high-k film as the raw material gas and using one of an oxidant and a nitridant as the reaction gas.

2. The method of claim 1, further comprising, prior to the step of forming the atomic layer seed, forming a seed layer on the inner surface of the recess by supplying a second silicon raw material gas to the target substrate while heating the target substrate to a third temperature, wherein the atomic layer seed is formed on the seed layer.

3. The method of claim 2, wherein the second silicon raw material gas is an aminosilane-based gas.

4. The method of claim 1, wherein the first silicon raw material gas includes a monosilane gas.

5. The method of claim 4, wherein the first silicon raw material gas includes the monosilane gas and a chlorine-containing Si compound gas.

6. The method of claim 5, wherein the chlorine-containing Si compound gas is a dichlorosilane gas.

7. The method of claim 1, wherein the target substrate includes a laminated film formed by laminating a plurality of different films on a base, the recess is formed in a laminating direction of the plurality of different films, and the plurality of different films exposed in a lateral surface of the recess serves as the plurality of different bases.

8. The method of claim 1, wherein the plurality of different bases is made of different materials, or made of the same material but each base is formed by a different method or is different in film quality.

9. The method of claim 1, wherein the bases include one of a $SiO_2$ film, a SiN film, a TiN film, and a high-k film.

10. A non-transitory computer-readable storage medium storing a computer-operable program for controlling a silicon film forming apparatus, wherein when executed, the program causes a computer to control the silicon film forming apparatus so as to perform the silicon film forming method of claim 1.

11. A method of forming a silicon film in a recess formed in a target substrate, comprising:

preparing a target substrate including a laminated film formed by alternately laminating a $SiO_2$ film and a SiN film on a base, and a recess formed in a laminating direction of the $SiO_2$ film and the SiN film, wherein the $SiO_2$ film and the SiN film are exposed in a lateral surface of the recess;

forming an atomic layer seed composed of a $SiO_2$ film on at least an inner surface of the recess by sequentially supplying a chlorine-containing Si compound gas and an oxidant to the target substrate one or more times while heating the target substrate to a first temperature; and forming a silicon film on a surface of the atomic layer seed so as to fill the recess by supplying a silicon raw material gas including a monosilane gas to the target substrate while heating the target substrate to a second temperature.

12. The method of claim 11, wherein the chlorine-containing Si compound gas used to form the atomic layer seed is a dichlorosilane gas and the oxidant is a $N_2O$ gas.

13. The method of claim 11, further comprising, prior to the act of forming the atomic layer seed, forming an aminosilane seed layer on the inner surface of the recess by supplying an aminosilane-based gas to the target substrate while heating the target substrate to a third temperature, wherein the atomic layer seed is formed on the aminosilane seed layer.

14. The method of claim 11, wherein the silicon raw material gas used in the act of forming the silicon film includes the monosilane gas and a chlorine-containing Si compound gas.

15. The method of claim 14, wherein the chlorine-containing Si compound gas is a dichlorosilane gas.

16. The method of claim 11, wherein the first temperature falls within a range of 100 to 600 degrees C.

* * * * *